United States Patent
Suh et al.

(10) Patent No.: US 11,950,412 B2
(45) Date of Patent: Apr. 2, 2024

(54) GATE FRINGING EFFECT BASED CHANNEL FORMATION FOR SEMICONDUCTOR DEVICE

(71) Applicant: LONGITUDE FLASH MEMORY SOLUTIONS LTD., Dublin (IE)

(72) Inventors: Youseok Suh, Cupertino, CA (US); Sung-Yong Chung, Davis, CA (US); Ya-Fen Lin, Saratoga, CA (US); Yi-Ching Jean Wu, Sunnyvale, CA (US)

(73) Assignee: Longitude Flash Memory Solutions LTD., Dublin (IE)

( * ) Notice: Subject to any disclaimer, the term of this patent is extended or adjusted under 35 U.S.C. 154(b) by 0 days.

(21) Appl. No.: 17/670,975

(22) Filed: Feb. 14, 2022

(65) Prior Publication Data
US 2022/0173116 A1 Jun. 2, 2022

Related U.S. Application Data

(60) Continuation of application No. 16/380,209, filed on Apr. 10, 2019, now Pat. No. 11,251,189, which is a
(Continued)

(51) Int. Cl.
*H01L 29/788* (2006.01)
*H01L 21/28* (2006.01)
(Continued)

(52) U.S. Cl.
CPC ........ *H10B 41/35* (2023.02); *H01L 29/40117* (2019.08); *H01L 29/4234* (2013.01);
(Continued)

(58) Field of Classification Search
CPC ........ H10B 41/35; H10B 41/30; H10B 43/30; H10B 43/35; H01L 29/40117;
(Continued)

(56) References Cited

U.S. PATENT DOCUMENTS

| 5,677,556 A | 10/1997 | Endoh |
| 6,114,182 A | 9/2000 | Tabara |

(Continued)

FOREIGN PATENT DOCUMENTS

| DE | 10246175 B4 | 8/2006 |
| DE | 102009023789 A1 | 12/2009 |

(Continued)

*Primary Examiner* — Tan N Tran
(74) *Attorney, Agent, or Firm* — Kunzler Bean & Adamson

(57) ABSTRACT

A memory device is described. Generally, the device includes a string of memory transistors, a source select transistor coupled to a first end of the string of memory transistor and a drain select transistor coupled to a second end of the string of memory transistor. Each memory transistor includes a gate electrode formed adjacent to a charge trapping layer and there is neither a source nor a drain junction between adjacent pairs of memory transistors or between the memory transistors and source select transistor or drain select transistor. In one embodiment, the memory transistors are spaced apart from adjacent memory transistors and the source select transistor and drain select transistor, such that channels are formed therebetween based on a gate fringing effect associated with the memory transistors. Other embodiments are also described.

20 Claims, 5 Drawing Sheets

Related U.S. Application Data continuation of application No. 15/403,422, filed on Jan. 11, 2017, now Pat. No. 10,297,606, which is a continuation of application No. 14/179,316, filed on Feb. 12, 2014, now Pat. No. 9,570,458, which is a division of application No. 12/368,023, filed on Feb. 9, 2009, now Pat. No. 8,692,310.

(51) Int. Cl.
*H01L 29/423* (2006.01)
*H01L 29/66* (2006.01)
*H01L 29/792* (2006.01)
*H10B 41/30* (2023.01)
*H10B 41/35* (2023.01)
*H10B 43/30* (2023.01)
*H10B 43/35* (2023.01)

(52) U.S. Cl.
CPC .. *H01L 29/66825* (2013.01); *H01L 29/66833* (2013.01); *H01L 29/7881* (2013.01); *H01L 29/792* (2013.01); *H10B 41/30* (2023.02); *H10B 43/30* (2023.02); *H10B 43/35* (2023.02)

(58) Field of Classification Search
CPC ........... H01L 29/4234; H01L 29/66825; H01L 29/66833; H01L 29/7881; H01L 29/792; H01L 27/11568; H01L 27/11521; H01L 27/11524; H01L 27/1157
USPC ........................................ 257/315, 321, 324
See application file for complete search history.

(56) References Cited

U.S. PATENT DOCUMENTS

| | | | |
|---|---|---|---|
| 6,117,725 | A | 9/2000 | Huang |
| 6,175,522 | B1 | 1/2001 | Fang |
| 6,242,303 | B1 | 6/2001 | Wang et al. |
| 6,249,454 | B1 | 6/2001 | Sung et al. |
| 6,255,173 | B1 | 7/2001 | Jang |
| 6,281,092 | B1 | 8/2001 | Ahmad |
| 6,313,497 | B1 | 11/2001 | Iwasa |
| 6,326,661 | B1 | 12/2001 | Dormans et al. |
| 6,338,993 | B1 | 1/2002 | Lien |
| 6,338,998 | B1 | 1/2002 | Wang et al. |
| 6,376,358 | B1 | 4/2002 | Fischer et al. |
| 6,385,090 | B1 | 5/2002 | Kitazaki |
| 6,395,590 | B1 | 5/2002 | Leu |
| 6,426,256 | B1 | 7/2002 | Chen |
| 6,429,479 | B1 | 8/2002 | Han et al. |
| 6,451,653 | B2 | 9/2002 | Maurelli |
| 6,462,585 | B1 | 10/2002 | Bernstein et al. |
| 6,486,050 | B1 | 11/2002 | Lee |
| 6,487,117 | B1 | 11/2002 | Choi et al. |
| 6,501,147 | B1 | 12/2002 | Vajana et al. |
| 6,521,934 | B2 | 2/2003 | Yasuda |
| 6,521,957 | B2 | 2/2003 | Patelmo et al. |
| 6,528,414 | B1 | 3/2003 | Kasuya |
| 6,576,517 | B1 | 6/2003 | Patelmo et al. |
| 6,579,757 | B2 | 6/2003 | Kim et al. |
| 6,650,566 | B2 | 11/2003 | Jeong et al. |
| 6,661,707 | B2 | 12/2003 | Choi et al. |
| 6,699,754 | B2 | 3/2004 | Huang |
| 6,720,613 | B1 | 4/2004 | Chang |
| 6,727,544 | B2 * | 4/2004 | Endoh .................... H10B 69/00 257/305 |
| 6,734,106 | B2 | 5/2004 | Chung et al. |
| 6,774,428 | B1 | 8/2004 | Hung et al. |
| 6,783,997 | B2 | 8/2004 | Rotondaro et al. |
| 6,797,570 | B2 | 9/2004 | Shin et al. |
| 6,800,515 | B2 | 10/2004 | Piazza |
| 6,888,773 | B2 | 5/2005 | Morimoto |
| 6,891,754 | B2 | 5/2005 | Jeong et al. |
| 6,898,120 | B2 | 5/2005 | Natori |
| 6,936,885 | B2 | 8/2005 | Shin et al. |
| 6,977,842 | B2 | 12/2005 | Nazarian |
| 6,995,410 | B2 | 2/2006 | Hosono et al. |
| 7,002,845 | B2 | 2/2006 | Nakamura et al. |
| 7,009,244 | B2 | 3/2006 | Jenq et al. |
| 7,009,888 | B2 | 3/2006 | Masuoka et al. |
| 7,015,540 | B2 | 3/2006 | Ishii et al. |
| 7,031,194 | B2 | 4/2006 | Inoue |
| 7,061,275 | B2 | 6/2006 | Wang |
| 7,064,031 | B2 | 6/2006 | Shih |
| 7,091,522 | B2 | 8/2006 | Lee et al. |
| 7,105,888 | B2 | 9/2006 | Yoshino |
| 7,118,968 | B2 | 10/2006 | Hsieh |
| 7,118,972 | B2 | 10/2006 | Shinohara et al. |
| 7,148,538 | B2 | 12/2006 | Forbes |
| 7,157,771 | B2 | 1/2007 | Forbes |
| 7,161,833 | B2 | 1/2007 | Hemink |
| 7,187,029 | B2 | 3/2007 | Sugita et al. |
| 7,190,024 | B2 | 3/2007 | Kang et al. |
| 7,196,930 | B2 | 3/2007 | Han et al. |
| 7,208,419 | B2 | 4/2007 | Jin et al. |
| 7,217,621 | B2 | 5/2007 | Chen et al. |
| 7,223,659 | B2 | 5/2007 | Shin et al. |
| 7,232,722 | B2 | 5/2007 | Van Houdt et al. |
| 7,238,571 | B1 * | 7/2007 | Tokuno .................. H10B 69/00 438/258 |
| 7,247,907 | B2 | 7/2007 | Gao et al. |
| 7,285,816 | B2 | 10/2007 | Bonanomi |
| 7,303,964 | B2 | 12/2007 | Shiraiwa et al. |
| 7,319,611 | B2 | 1/2008 | Wu et al. |
| 7,320,931 | B2 | 1/2008 | Thomas et al. |
| 7,326,988 | B2 | 2/2008 | Yamamoto |
| 7,339,239 | B2 | 3/2008 | Forbes |
| 7,348,245 | B2 | 3/2008 | Shinohara et al. |
| 7,369,436 | B2 | 5/2008 | Forbes |
| 7,378,336 | B2 | 5/2008 | Chan et al. |
| 7,385,249 | B2 | 6/2008 | Yang |
| 7,397,080 | B2 | 7/2008 | Wong et al. |
| 7,402,492 | B2 | 7/2008 | Jeon et al. |
| 7,410,872 | B2 | 8/2008 | Maurelli |
| 7,411,241 | B2 | 8/2008 | Kim et al. |
| 7,416,940 | B1 * | 8/2008 | Torii ...................... H10B 69/00 438/257 |
| 7,419,870 | B2 | 9/2008 | Shin |
| 7,432,183 | B2 | 10/2008 | Lim et al. |
| 7,432,206 | B2 | 10/2008 | Lung |
| 7,435,637 | B2 | 10/2008 | Doyle |
| 7,449,744 | B1 | 11/2008 | Yu et al. |
| 7,457,156 | B2 | 11/2008 | Nazarian |
| 7,459,390 | B2 | 12/2008 | Niimi et al. |
| 7,466,590 | B2 | 12/2008 | Hemink et al. |
| 7,473,963 | B2 | 1/2009 | Kim et al. |
| 7,485,530 | B2 | 2/2009 | Yeh |
| 7,489,010 | B2 | 2/2009 | Takeuchi |
| 7,491,622 | B2 | 2/2009 | Turner et al. |
| 7,495,267 | B2 | 2/2009 | Lee et al. |
| 7,495,282 | B2 | 2/2009 | Orimoto et al. |
| 7,510,929 | B2 | 3/2009 | Chen |
| 7,521,348 | B2 | 4/2009 | Kwon et al. |
| 7,521,364 | B2 | 4/2009 | Chen |
| 7,544,566 | B2 | 6/2009 | Yu et al. |
| 7,544,984 | B2 | 6/2009 | Forbes et al. |
| 7,547,941 | B2 | 6/2009 | Chen |
| 7,547,949 | B2 | 6/2009 | Juengling |
| 7,550,353 | B2 | 6/2009 | Lee et al. |
| 7,582,529 | B2 | 9/2009 | Matamis et al. |
| 7,601,591 | B2 | 10/2009 | Hwang et al. |
| 7,608,882 | B2 | 10/2009 | Lung et al. |
| 7,615,820 | B2 | 11/2009 | Yuan |
| 7,623,389 | B2 | 11/2009 | Lee et al. |
| 7,626,226 | B2 | 12/2009 | Govoreanu |
| 7,633,803 | B2 | 12/2009 | Lee |
| 7,638,402 | B2 | 12/2009 | Nandakumar et al. |
| 7,642,160 | B2 | 1/2010 | Mokhlesi |
| 7,646,641 | B2 | 1/2010 | Chen et al. |
| 7,652,340 | B2 | 1/2010 | Lee et al. |
| 7,663,177 | B2 | 2/2010 | Lin et al. |
| 7,666,800 | B2 | 2/2010 | Marokkey et al. |
| 7,687,307 | B2 | 3/2010 | Lung |

(56) References Cited

U.S. PATENT DOCUMENTS

| | | |
|---|---|---|
| 7,691,689 B2 | 4/2010 | Jang et al. |
| 7,696,552 B2 | 4/2010 | Youn et al. |
| 7,701,771 B2 | 4/2010 | Jeong et al. |
| 7,709,836 B2 | 5/2010 | Knott et al. |
| 7,709,884 B2 | 5/2010 | Schuler et al. |
| 7,713,854 B2 | 5/2010 | Chen et al. |
| 7,714,372 B2 | 5/2010 | Kim |
| 7,736,959 B2 | 6/2010 | Fazan |
| 7,745,285 B2 | 6/2010 | Mokhlesi |
| 7,749,854 B2 | 7/2010 | Lung |
| 7,750,415 B2 | 7/2010 | Zhu |
| 7,759,719 B2 | 7/2010 | Wang |
| 7,767,588 B2 | 8/2010 | Luo et al. |
| 7,772,060 B2 | 8/2010 | Jumpertz et al. |
| 7,785,993 B2 | 8/2010 | Pawlak et al. |
| 7,787,277 B2 | 8/2010 | Nakamura et al. |
| 7,795,119 B2 | 9/2010 | Lo et al. |
| 7,807,529 B2 | 10/2010 | Purayath et al. |
| 7,816,270 B2 | 10/2010 | Park et al. |
| 7,816,723 B2 | 10/2010 | Klinger et al. |
| 7,824,994 B2 | 11/2010 | Prall et al. |
| 7,825,398 B2 | 11/2010 | Happ et al. |
| 7,825,462 B2 | 11/2010 | Tang et al. |
| 7,834,388 B2 | 11/2010 | Yu et al. |
| 7,842,536 B2 | 11/2010 | Lung |
| 7,843,015 B2 | 11/2010 | Chiu et al. |
| 7,846,843 B2 | 12/2010 | Chung et al. |
| 7,847,341 B2 | 12/2010 | Chen et al. |
| 7,851,847 B2 | 12/2010 | Hong |
| 7,858,472 B2 | 12/2010 | Yuan et al. |
| 7,859,050 B2 | 12/2010 | Juengiing |
| 7,863,655 B2 | 1/2011 | Lung |
| 7,867,815 B2 | 1/2011 | Lung et al. |
| 7,884,342 B2 | 2/2011 | Lung |
| 7,888,203 B2 | 2/2011 | Lee et al. |
| 7,888,210 B2 | 2/2011 | Purayath et al. |
| 7,889,557 B2 * | 2/2011 | Park ............ H10B 41/35 257/E27.102 |
| 7,893,418 B2 | 2/2011 | Lung |
| 7,897,954 B2 | 3/2011 | Lee et al. |
| 7,898,019 B2 | 3/2011 | Keller et al. |
| 7,902,589 B2 | 3/2011 | Ho et al. |
| 7,907,448 B2 | 3/2011 | Suh et al. |
| 7,910,434 B2 | 3/2011 | Chien et al. |
| 7,910,906 B2 | 3/2011 | Lung |
| 7,910,974 B2 | 3/2011 | Utsuno |
| 7,915,664 B2 | 3/2011 | Chien et al. |
| 7,919,413 B2 | 4/2011 | Chen |
| 7,919,799 B2 | 4/2011 | Shinkawata |
| 7,919,829 B2 | 4/2011 | Trivedi et al. |
| 7,936,005 B2 | 5/2011 | Okamura |
| 7,939,451 B2 | 5/2011 | Tsai et al. |
| 7,943,452 B2 | 5/2011 | Li et al. |
| 7,944,023 B2 | 5/2011 | Cao |
| 7,944,749 B2 | 5/2011 | Lee et al. |
| 7,960,803 B2 | 6/2011 | Ahn et al. |
| 7,977,729 B2 | 7/2011 | Watanabe et al. |
| 7,989,914 B2 | 8/2011 | Borot et al. |
| 8,008,114 B2 | 8/2011 | Lung et al. |
| 8,026,535 B2 | 9/2011 | Wakagi et al. |
| 8,030,160 B2 | 10/2011 | Orimoto et al. |
| 8,030,634 B2 | 10/2011 | Lung et al. |
| 8,039,348 B2 | 10/2011 | Juengling |
| 8,044,452 B2 | 10/2011 | Koji et al. |
| 8,063,433 B2 | 11/2011 | Ishimaru et al. |
| 8,072,023 B1 | 12/2011 | Wang |
| 8,084,353 B2 | 12/2011 | Chen |
| 8,088,664 B2 | 1/2012 | Haussmann et al. |
| 8,097,487 B2 | 1/2012 | Lung |
| 8,101,992 B2 | 1/2012 | Forbes |
| 8,105,909 B2 | 1/2012 | Joo et al. |
| 8,110,507 B2 | 2/2012 | Park |
| 8,119,481 B2 | 2/2012 | Lai et al. |
| 8,120,101 B2 | 2/2012 | Tang et al. |
| 8,138,526 B2 | 3/2012 | Wilson et al. |
| 8,174,062 B2 | 5/2012 | Ashida |
| 8,183,613 B2 | 5/2012 | Jeong et al. |
| 8,188,533 B2 | 5/2012 | Forbes |
| 8,188,536 B2 | 5/2012 | Liu et al. |
| 8,222,071 B2 | 7/2012 | Lung |
| 8,223,549 B2 | 7/2012 | Aritome et al. |
| 8,227,355 B2 | 7/2012 | Hori |
| 8,243,518 B2 | 8/2012 | Oh et al. |
| 8,252,646 B2 | 8/2012 | Figura et al. |
| 8,259,503 B2 | 9/2012 | Park et al. |
| 8,278,156 B2 | 10/2012 | Pierrat |
| 8,283,253 B2 | 10/2012 | Yaegashi et al. |
| 8,293,613 B2 | 10/2012 | Park et al. |
| 8,295,089 B2 | 10/2012 | Jeong et al. |
| 8,318,569 B2 | 11/2012 | Lee |
| 8,383,495 B2 | 2/2013 | Murphy et al. |
| 8,426,272 B2 | 4/2013 | Yoon et al. |
| 8,456,918 B2 | 6/2013 | Oh et al. |
| 8,471,295 B2 | 6/2013 | Lee |
| 8,471,307 B2 | 6/2013 | Khamankar et al. |
| 8,488,381 B2 | 7/2013 | Kim et al. |
| 8,492,813 B2 | 7/2013 | Shinkawata |
| 8,519,466 B2 | 8/2013 | Forbes et al. |
| 8,546,152 B2 | 10/2013 | Orimoto et al. |
| 8,546,215 B2 | 10/2013 | Haller et al. |
| 8,546,251 B1 | 10/2013 | Sachan et al. |
| 8,609,487 B2 | 12/2013 | Natori et al. |
| 8,685,859 B2 | 4/2014 | Werner et al. |
| 8,692,310 B2 | 4/2014 | Suh et al. |
| 8,717,819 B2 | 5/2014 | Aritome et al. |
| 8,735,297 B2 | 5/2014 | Kurjanowicz |
| 8,735,963 B2 | 5/2014 | Wang et al. |
| 8,759,170 B2 | 6/2014 | Forbes et al. |
| 8,766,410 B2 | 7/2014 | Cai et al. |
| 8,772,840 B2 | 7/2014 | Juengling |
| 8,796,770 B2 | 8/2014 | Okhonin |
| 8,824,209 B2 | 9/2014 | Kim et al. |
| 8,877,589 B2 | 11/2014 | Hanson et al. |
| 8,878,282 B2 | 11/2014 | Yaegashi |
| 8,916,912 B2 | 12/2014 | Juengling |
| 8,937,340 B2 | 1/2015 | Lue et al. |
| 8,963,226 B2 | 2/2015 | Okazaki et al. |
| 9,070,791 B2 | 6/2015 | Barrows et al. |
| 9,082,829 B2 | 7/2015 | Wells |
| 9,214,525 B2 | 12/2015 | Chen |
| RE45,832 E | 1/2016 | Maeda et al. |
| 9,331,180 B2 | 5/2016 | Utsuno |
| 9,437,431 B2 | 9/2016 | Trefonas, III et al. |
| 9,449,693 B2 | 9/2016 | Widjaja et al. |
| 9,460,924 B2 | 10/2016 | Maszara et al. |
| 9,570,458 B2 | 2/2017 | Suh et al. |
| 9,583,204 B2 | 2/2017 | Kim |
| 9,960,258 B2 | 5/2018 | Hu |
| 2006/0138563 A1 | 6/2006 | Park et al. |
| 2007/0205445 A1 | 9/2007 | Park et al. |
| 2008/0117683 A1 * | 5/2008 | Hemink ............ G11C 11/5621 365/185.18 |
| 2008/0135912 A1 | 6/2008 | Lee et al. |
| 2008/0259688 A1 | 10/2008 | Kim et al. |
| 2008/0273389 A1 * | 11/2008 | Aritome ............ G11C 16/10 365/185.17 |
| 2008/0318381 A1 | 12/2008 | Matamis et al. |
| 2009/0103371 A1 | 4/2009 | Goda et al. |

FOREIGN PATENT DOCUMENTS

| | | |
|---|---|---|
| DE | 102007031278 B4 | 8/2012 |
| DE | 102009052705 B4 | 5/2016 |
| EP | 1181694 B1 | 12/2004 |
| EP | 1513160 B1 | 1/2007 |
| EP | 1308962 B1 | 3/2008 |
| EP | 1777708 B1 | 5/2008 |
| EP | 1829044 B1 | 11/2008 |
| EP | 1636803 B1 | 12/2008 |
| EP | 1538633 B1 | 3/2010 |
| EP | 1552529 B1 | 11/2010 |
| EP | 1573745 B1 | 12/2010 |
| EP | 1884956 B1 | 3/2012 |
| EP | 2264756 B1 | 8/2012 |

(56) References Cited

FOREIGN PATENT DOCUMENTS

| | | |
|---|---:|---|
| EP | 1579479 B1 | 3/2013 |
| EP | 1514309 B1 | 11/2013 |
| EP | 2290642 B1 | 12/2015 |
| EP | 1416540 B1 | 9/2016 |
| EP | 1974383 B1 | 10/2016 |
| EP | 3413351 A1 | 12/2018 |
| JP | H05291584 A | 11/1993 |
| JP | 4969748 B2 | 7/2012 |
| KR | 100843713 B1 | 7/2008 |
| KR | 101535227 B1 | 7/2015 |
| TW | I392063 B | 4/2013 |
| TW | I405243 B | 8/2013 |
| TW | I405244 B | 8/2013 |
| TW | I406360 B | 8/2013 |
| TW | I408752 B | 9/2013 |

\* cited by examiner

GATE FRINGING EFFECT BASED CHANNEL FORMATION FOR SEMICONDUCTOR DEVICE

CROSS-REFERENCE TO RELATED APPLICATION

This application is a continuation of U.S. patent application Ser. No. 16/380,209, filed Apr. 10, 2019, which is a continuation of U.S. patent application Ser. No. 15/403,422, filed on Jan. 11, 2017, which is a continuation of U.S. patent application Ser. No. 14/179,316, filed on Feb. 12, 2014, now U.S. Pat. No. 9,570,458, issued on Feb. 14, 2017, which is a divisional of U.S. patent application Ser. No. 12/368,023, filed on Feb. 9, 2009, now U.S. Pat. No. 8,692,310, issued on Apr. 8, 201.4, all of which are incorporated by reference herein in their entirety.

FIELD OF TECHNOLOGY

This disclosure relates generally to technical fields of semiconductor manufacturing.

BACKGROUND

A conventional NAND flash memory device 100 includes multiple NAND strings of memory transistors. FIG. 1 illustrates two NAND strings of the conventional NAND flash memory device 100. To program a memory transistor 102, a selected bitline 1 is grounded by passing a bitline select voltage 104 of 0 volt through the drain of a drain select (DS) transistor 1 to a node of the memory transistor 102, while a bitline 2 and the rest of the bitlines are self boosted by coupling to a programming voltage 118 and/or a pass voltage 120 to inhibit the programming. A drain select (DS) line 108 and a source select (SS) line 110 are coupled to a node of a DS voltage 112 and to a node of a SS voltage 114, respectively. The supply voltage of the DS line 108 turns on the DS transistor 1 and maintains the connection of the bitline 1 to the bitline select voltage 104, but it turns off the DS transistor 2, thus disconnecting the bitline 2 from the bitline unselect voltage 106. The SS voltage 114 coupled to the SS line 110 turns off both the SS transistor 1 and the SS transistor 2, thus isolating the two bitlines from a node of a common source voltage 116 during the programming.

Furthermore, a wordline N coupled to the control gate of the memory transistor 102 is applied by the programming voltage 118 of 18 volts while the unselected wordlines are applied by the pass voltage 120 of 11 volts. Since the channel of the bitline 1 is coupled to the bitline select voltage 104 of 0 volt, it is maintained at the channel voltage of 0 volt, whereas the channel potential of the bitline 2 is coupled up by the programming voltage 118 and/or the pass voltage 120. For example, with the pass voltage 120 of 11 volts being supplied to the unselected wordlines, the channel voltage of the bitline 2 may range between 6 to 9 volts.

Before the programming takes place, the threshold voltage of the cell 102 is about −2 volt. When the programming voltage 118 is applied, the high voltage of the programming voltage 118 causes the tunneling of electrons from the silicon substrate of the memory transistor 102 to the charge trap layer of the memory transistor 102, thus increasing the threshold voltage to a positive voltage of 1 volt, whereas the voltage differential between the silicon substrate and the floating gate of each unselected cell is not large enough to cause the change in the threshold voltage of its respective transistor.

FIG. 2 illustrates an exploded view of a portion of the bitline 2 viewed across Y-direction which includes the SS transistor 2, a memory transistor 122 (e.g., coupled to an edge wordline, such as the wordline N), and a memory transistor 124. The SS transistor 2 controls the bitline 2 for connecting to a common source 202. Furthermore, the SS transistor 2 is 200 nm in size, the transistors 90 nm in size, and the channels 100 nm in size. The boosted junction potential between the SS transistor 2 and the memory transistor 122 may range between 6 and 9 volts, where the gate of the SS transistor 2 is grounded. Provided that the channel voltage for unselected bitline 2 being 6 to 9 volts, the gate voltage of the memory transistor 122 being 18 volts, and the gate voltage of the SS transistor 2 being 0 volt, there is a great disturbance with the band-to-band tunneling of the memory transistor 122. That is, the memory transistor 122 is disturbed by an electron hole pair (EHP) generation due to a gate induced drain junction leakage (GDIL) current.

The GIDL current arises in a high electric field under a gate-junction overlap region and a low gate to drain bias. The GIDL current occurs when current flows from the junction 204 in direction to the substrate 208 under the gate-junction overlap region, such as the overlap region of the gate of the SS transistor 2 and the junction 204. The GIDL is due to the formation of the depletion region and the region's high electric field in presence of the low or negative bias in the gate of the SS transistor 2 (e.g., 0 volt), and the positive bias in the junction 204 of the cell 122 (e.g., 6 to 9 volts). In the overlap gate-junction region, the high electric field creates electron-hole pairs (EHPs) where electrons through the barrier height are collected by the junction 204, and the holes (e.g., a hole 210) are collected by the substrate 208. When the electrons (e.g., an electron 212) generated due to the GIDL jump on a charge trapping layer 214 of the memory transistor 122, the electrons may program the memory transistor 122, which is not selected for programming, thus resulting in a programming error.

As the chip size gets smaller, the smaller channel length may create a short channel effect where the drain voltage of each transistor in the chip has more effect on the drain current than the gate to source voltage has. Accordingly, the short channel effect may contribute to the occurrence of the programming error due to the GIDL, which is another obstacle to the industry's effort for scaling down the chip size.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a NAND flash memory device which comprises multiple NAND strings of memory transistors, with each one of the memory transistors including a charge trapping layer and a gate electrode formed on the charge trapping layer, where the memory transistors are formed close to each other to form a channel between an adjacent pair of the memory transistors based on a gate fringing effect associated with the adjacent pair of the memory transistors.

Another embodiment described in the detailed description is directed to a method for forming a NAND string of memory transistors which comprises forming multiple charge trapping layers on a semiconductor substrate, and forming respective gate electrodes on the charge trapping layers, where the memory transistors are formed close to each other to form a channel between an adjacent pair of the memory transistors based on a gate fringing effect associated with the adjacent pair of the memory transistors.

As illustrated in the detailed description, other embodiments pertain to devices and methods that provide an improved fabrication process of a NAND flash memory device, and in particular, an omission of drain and source region formation from the conventional methods of fabricating the NAND flash memory device. By forming memory transistors of the NAND flash memory device sufficiently close to each other, the channels between adjacent pairs of the memory transistors can be formed based on gate fringing effects of their gate electrodes. As a result, the fabrication process of the NAND flash memory device can be simplified significantly. In addition, since there is neither source nor drain region formed in the NAND flash memory device, the programming error due to the GIDL current can be eliminated. Furthermore, since there is no need to worry about the short channel effect with the elimination of the junction region in the device, the NAND flash memory device can be further scaled down.

BRIEF DESCRIPTION OF THE DRAWINGS

Example embodiments are illustrated by way of example and not limitation in the figures of the accompanying drawings, in which like references indicate similar elements and in which.

Figure 1:
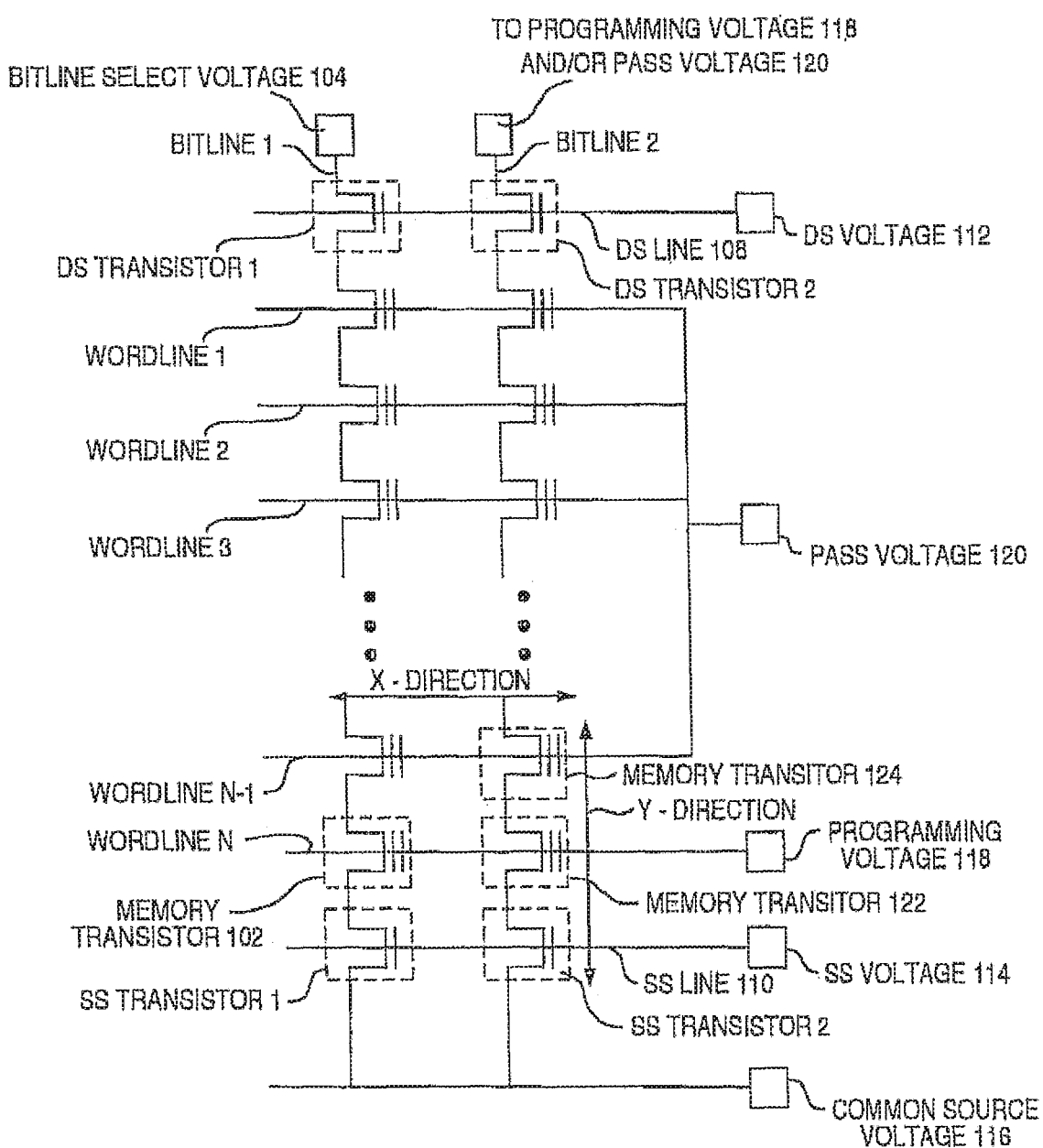
FIG. 1 illustrates two NAND strings of the conventional NAND flash memory device.
Figure 2:
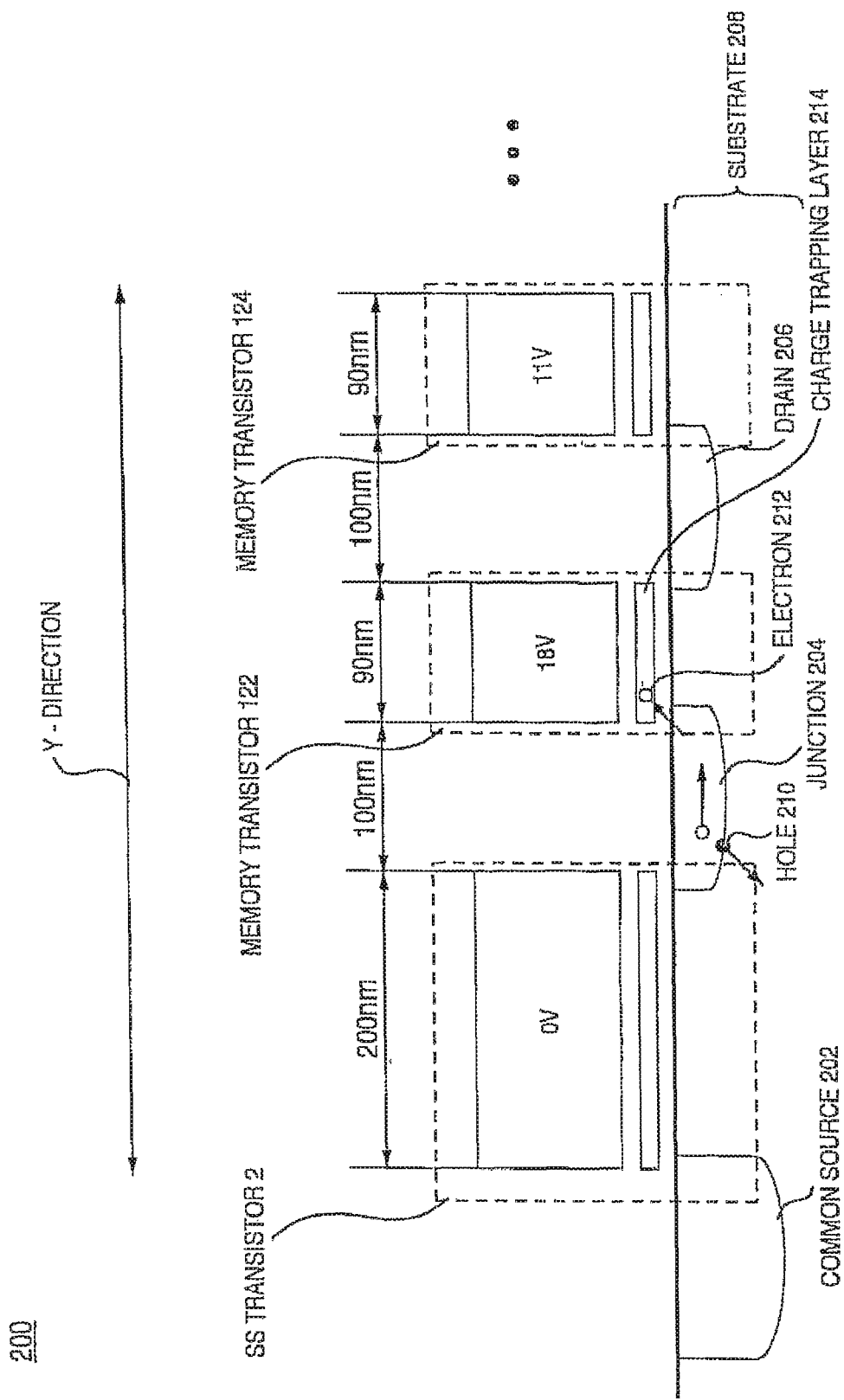
FIG. 2 illustrates an exploded view of a NAND string of the conventional NAND flash memory device of FIG. 1.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, other embodiments pertain to devices and methods that provide an improved fabrication process of a NAND flash memory device, and in particular, an omission of drain and source region formation from the conventional methods of fabricating the NAND flash memory device. By forming memory transistors of the NAND flash memory device sufficiently close to each other, the channels between adjacent ones of the memory transistors can be formed based on gate fringing effects of their gate electrodes. As a result, the fabrication process of the NAND flash memory device can be simplified significantly. In addition, since there is neither a source nor a drain region formed in the NAND flash memory device, the programming error due to the GIDL current can be eliminated. Furthermore, since there is no need to worry about the short channel effect with the elimination of the junction region in the device, the NAND flash memory device can be further scaled down.

Figure 3:
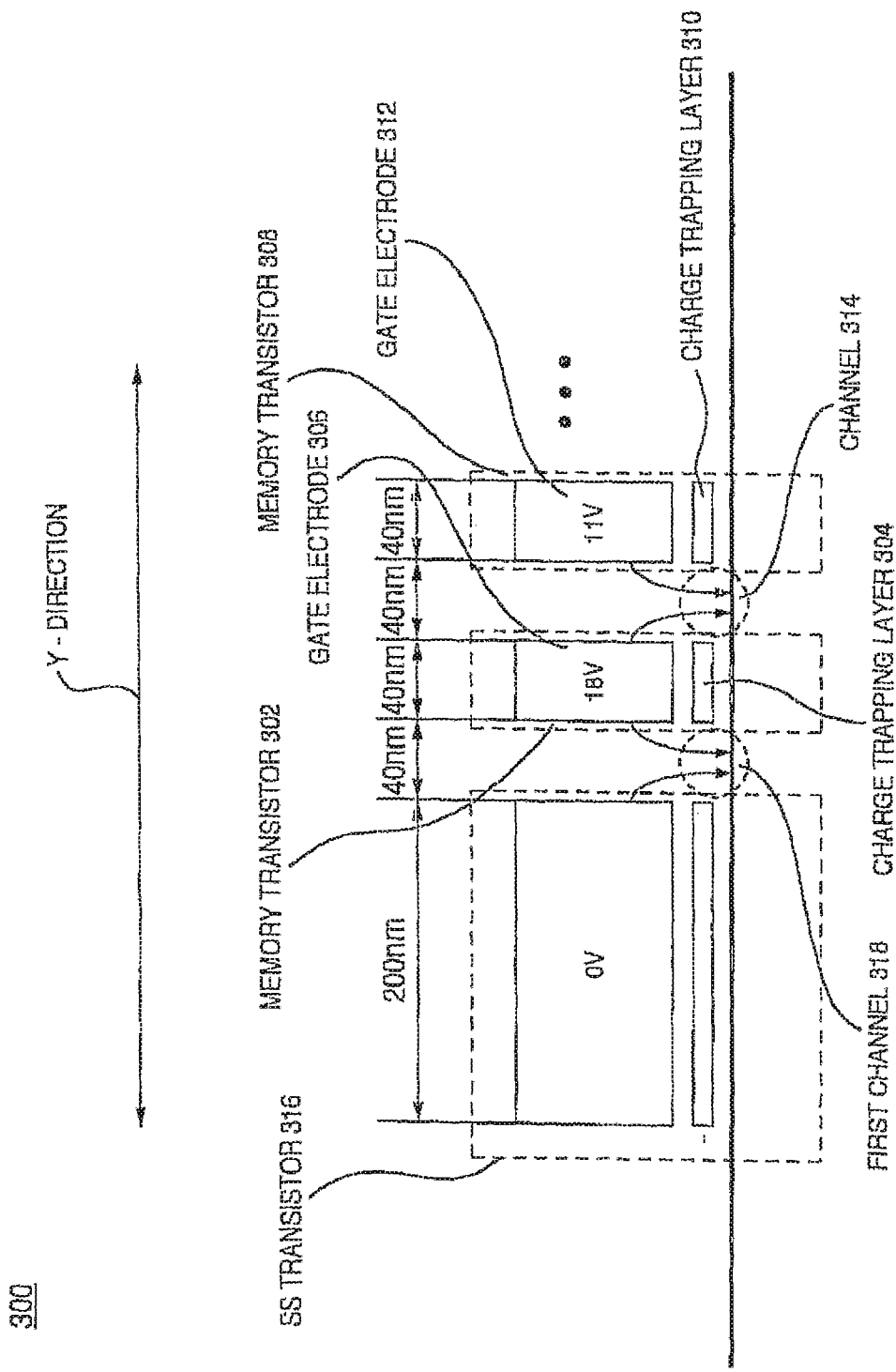
FIG. 3 illustrates an exploded view of a NAND string of an exemplary NAND flash memory device, according to one embodiment.

FIG. 3 illustrates an exploded view of a NAND string of an exemplary NAND flash memory device, according to one embodiment. The NAND flash memory device includes multiple NAND strings (e.g., bitlines) of memory transistors, and each memory transistor (e.g., a memory transistor 302, a memory transistor 308, etc.) includes a charge trapping layer (e.g., a charge trapping layer 304, a charge trapping layer 310, etc.) and a gate electrode (e.g., a gate electrode 306, a gate electrode 312, etc.) formed on the charge trapping layer. In one embodiment, the memory transistors (e.g., a memory transistor 302, a memory transistor 308, etc.) are formed close to each other such that a channel (e.g., a channel 314) is formed between an adjacent pair of the memory transistors based on a gate fringing effect associated with the adjacent pair of the memory transistors. It is appreciated that the gate fringing effect is an electric field leakage through a periphery of the gate electrode (e.g., the gate electrode 306, the gate electrode 312, etc.) of each memory transistor. This effect becomes greater as the size of the NAND flash memory device becomes smaller.

Therefore, since the NAND flash memory device can form the channel between the adjacent memory transistors using the gate fringing effect, there is no need to form a source or a drain. In FIG. 3, the memory transistors are separated from each other by approximately 40 nanometers. In an alternative embodiment, the memory transistors can be separated from each other by less than 40 nanometers. As a result, the NAND flash memory device can be scaled down significantly without affecting its operation.

Similar to the NAND flash memory device 100 of FIG. 1, a source select line is coupled to each one of the multiple NAND strings of memory transistors, where the source select line comprises a source select transistor (e.g., a SS transistor 316) with a select gate at each intersection of the multiple NAND strings and the source select line. In addition, the source select transistor 316 and an adjacent memory transistor (e.g., the memory transistor 302) are formed close to each other such that a first channel 318 is formed between the source select transistor 316 and the adjacent memory transistor based on gate fringing effect associated with the source select transistor 316 and the adjacent memory transistor. The source select transistor 316 and the adjacent memory transistor are separated by approximately 40 nanometers or less.

It is appreciated that since there is neither source nor drain formed in the semiconductor substrate of the NAND flash memory device as illustrated in FIG. 3, there is no overlap region of the gate of the SS transistor 316 and the junction. Thus, no GIDL current is generated in the vicinity of the SS transistor 316. Therefore, there is no disturbance due to an electron hole pair (EHP) generation since there is no GDIL current. Accordingly, the occurrence of a programming error to the adjacent memory transistor (e.g., the memory transistor 302) can be eliminated since there is no EHP generation which causes the phenomenon.

Figure 4A:
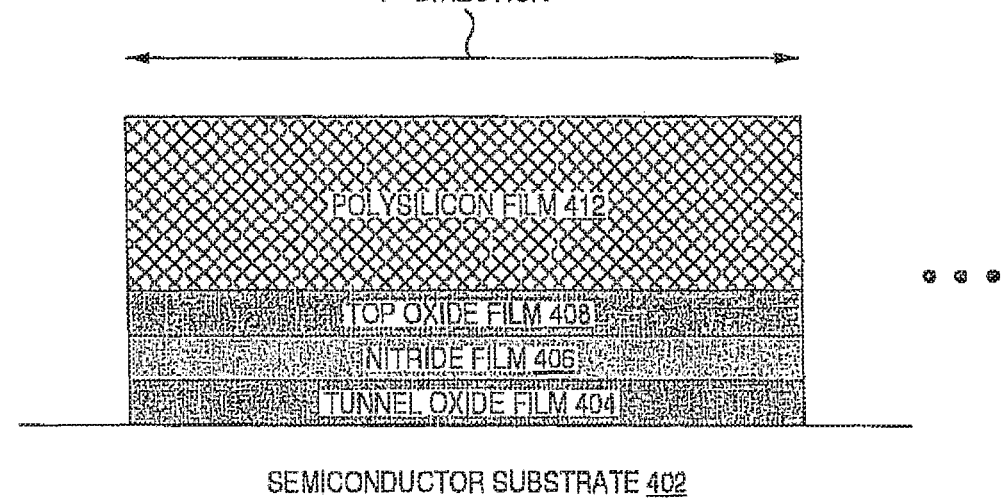
FIGS. 4(A) and 4(B) illustrate process steps for fabricating the NAND string of FIG. 3, according to one embodiment.
Figure 4B:
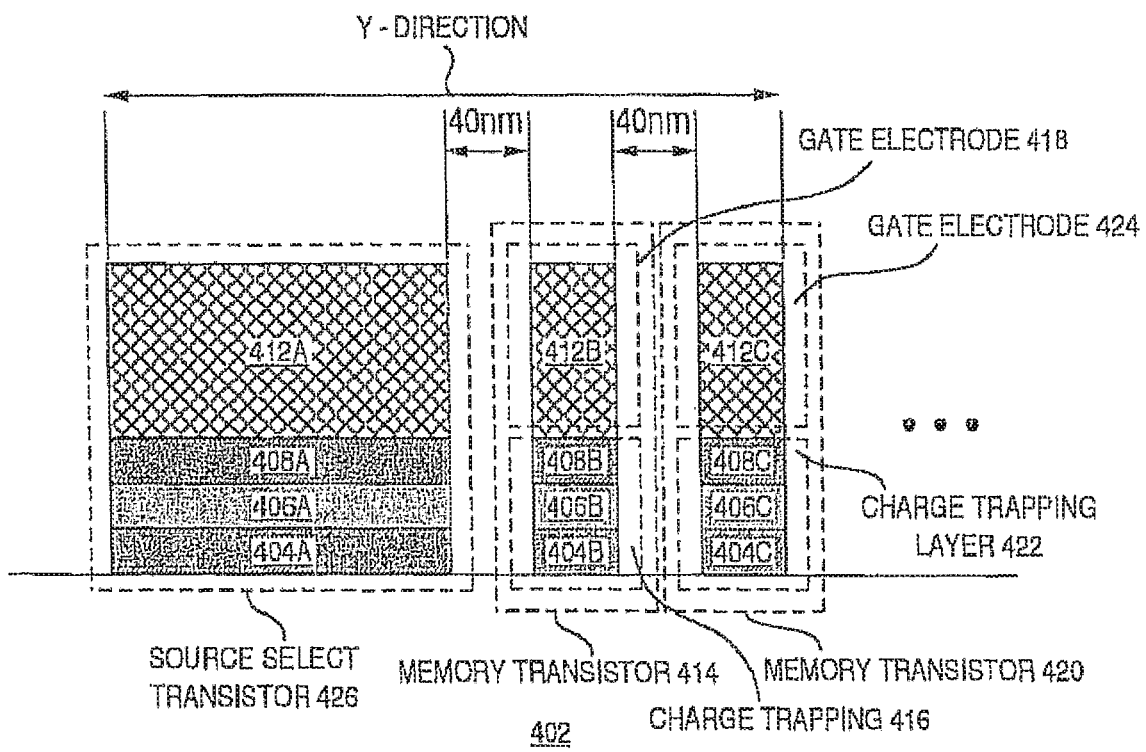

FIGS. 4(A) and 4(B) illustrate process steps for fabricating the NAND string of FIG. 3, according to one embodiment. In FIG. 4(A), a tunneling layer such as a tunnel oxide film 404 is formed on a semiconductor substrate 402. Next, a charge trap layer such as nitride film 406 is formed on the tunnel oxide film 404. Then, a top blocking layer such as a top oxide film 408 is formed on the nitride film 406. For example, the tunnel oxide film 404, the nitride film 406, and the top oxide film 408 form a charge trapping layer or a floating gate of a NAND flash memory device. Furthermore, a polysilicon film 412 or metal film is formed on the top oxide film 408 as a gate electrode.

FIG. 4(B) illustrates memory transistors (e.g., a memory transistor 414, a memory transistor 420, etc.) and a source select transistor 426 formed on the NAND string. It is appreciated that the memory transistors and the source select transistors 426 may be formed by a variety of masking and/or etching techniques. Each memory transistor includes a charge trapping layer (e.g., a charge trapping layer 416, a charge trapping layer 422, etc.) and a gate electrode (e.g., a gate electrode 418, a gate electrode 424, etc.) formed on the charge trapping layer. In one embodiment, the memory transistors comprise neither a source nor a drain since a channel between the memory transistors can be formed based on a gate fringing effect associated with the memory transistors. In order to form the channel based on the gate fringing effect, the memory transistors need to be sufficiently close to each other. In one exemplary implementation, the memory transistors are separated by approximately 40 nanometers. In another exemplary implementation, the adjacent ones of the memory transistors are separated by less than 40 nanometers. It is appreciated that the fabrication process illustrated in FIGS. 4(A) and 4(B) is significantly simpler than the conventional fabrication techniques since steps for forming diffusion regions serving as a source region and/or a drain region, such as implanting impurities in the semiconductor substrate, can be eliminated.

In one embodiment, similar to FIG. 1, the source select transistor 426 having a select gate is formed next to a memory transistor (e.g., the memory transistor 414). In addition, the source select transistor 426 and the memory transistor are formed close to each other such that a first channel is formed between the source select transistor 426 and the adjacent memory transistor based on a gate fringing effect associated with the source select transistor 426 and the adjacent memory transistor. In one exemplary implementation, the source select transistor 426 and the adjacent memory transistor are separated by approximately 40 nanometers. In another exemplary implementation, the source select transistor 426 and the adjacent memory transistor are separated by less than 40 nanometers. It is appreciated the space between the source select transistor 426 and the adjacent memory transistor may be same as the space between the adjacent pair of the memory transistors (e.g., the memory transistor 414, the memory transistor 420, etc.) to simplify the fabrication process of the NAND flash memory device.

Figure 5:
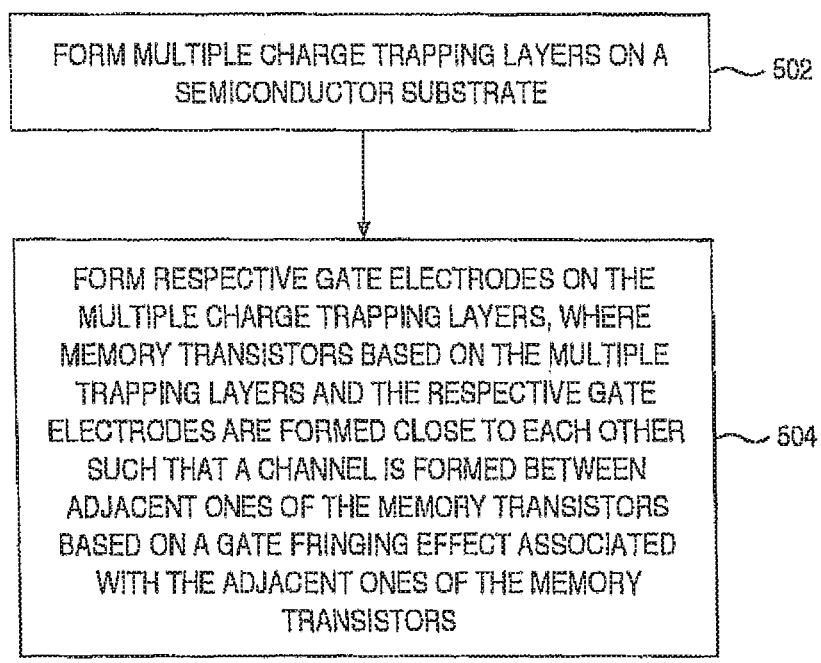
FIG. 5 is a process flow chart for forming a NAND string of an exemplary NAND flash memory device, according to one embodiment.

FIG. 5 is a process flow chart for forming a NAND string of an exemplary NAND flash memory device, according to one embodiment. In operation 502, multiple charge trapping layers are formed on a semiconductor substrate. In operation 504, respective gate electrodes are formed on the charge trapping layers, where the memory transistors are formed close to each other such that a channel is formed between an adjacent pair of the memory transistors based on a gate fringing effect associated with the adjacent pair of the memory transistors. In addition, a select line coupled to the NAND string of memory transistors is formed, where the source select line comprises a source select transistor with a select gate at an intersection of the NAND string of memory transistors and the source select line.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. A device comprising:
a base layer;
a first memory transistor comprising:
  a first gate electrode; and
  a first charge trapping layer disposed between the base layer and the first gate electrode; and
a second memory transistor comprising:
  a second gate electrode; and
  a second charge trapping layer disposed between the base layer and the second gate electrode;
a source select transistor comprising:
  a source select gate electrode;
wherein the source select transistor, the first memory transistor and the second memory transistor are disposed in a NAND string;
wherein the source select transistor is at one end of the NAND string, the first memory transistor is adjacent to the source select transistor and the second memory transistor is adjacent to the first memory transistor;
wherein the first memory transistor and the second memory transistor are separated by a first distance, which defines a first region;
wherein there is no diffusion region in the first region defined by the first distance;
wherein a conductive path is formed in the first region between the first and second memory transistors due to gate fringing field effects associated with the first and second memory transistors;
wherein the first memory transistor does not include a diffusion region for source and/or drain;

wherein the second memory transistor does not include a diffusion region for source and/or drain;
wherein the first memory transistor and source select transistor are separated by a second distance, which defines a second region;
wherein there is no diffusion region in the second region defined by the second distance;
wherein a conductive path is formed in the second region between the first memory transistor and the source select transistor due to gate fringing field effects associated with the first memory transistor and the source select transistor; and
wherein the source select transistor does not include a diffusion region for source and/or drain.

2. The device of claim 1, wherein the first distance is less than 40 nanometers.

3. The device of claim 1:
wherein the first charge trapping layer comprises:
a first oxide film;
a first charge trap layer or a first charge trap layer stack; and
a second oxide film;
wherein the second charge trapping layer comprises:
a third oxide film;
a second charge trap layer or a second charge trap layer stack; and
a fourth oxide film; and
wherein the first charge trap layer or the first charge trap layer stack is disposed between the first oxide film and the second oxide film, and the second charge trap layer or the second charge trap layer stack is disposed between the third oxide film and the fourth oxide film.

4. The device of claim 3, wherein the first charge trap layer or the first charge trap layer stack is a first nitride film or a first nitride film stack, and the second charge trap layer or second charge trap layer stack is a second nitride film or a second nitride film stack.

5. The device of claim 4, wherein the first gate electrode comprises a first metal or a poly silicon film and the second gate electrode comprises a second metal or a polysilicon film.

6. The device of claim 1, wherein the first charge trapping layer is a first floating gate of a NAND flash memory device and the second charge trapping layer is a second floating gate of the NAND flash memory device.

7. The device of claim 1, wherein the first distance is less than 40 nanometers and the second distance is less than 40 nanometers.

8. The device of claim 1, wherein the first distance and the second distance are approximately equal.

9. The device of claim 1, further comprising:
a drain select transistor comprising:
a drain select gate electrode; and
a drain select charge trapping layer disposed between the base layer and the drain select gate electrode;
a third memory transistor comprising:
a third gate electrode; and
a third charge trapping layer disposed between the base layer and the third gate electrode;
wherein the third memory transistor and the drain select transistor are disposed in the NAND string;
wherein the drain select transistor is at an other end of the NAND string and the third memory transistor is adjacent to the drain select transistor;
wherein the third memory transistor and the drain select transistor are separated by a third distance, which defines a third region;
wherein there is no diffusion region in the third region defined by the third distance;
wherein a conductive path is formed in the third region between the third memory transistor and the drain select transistor due to gate fringing field effects associated with the third memory transistor and the drain select transistor; and
wherein the drain select transistor does not include a diffusion region for source and/or drain.

10. The device of claim 9, wherein the first distance, the second distance and the third distance are approximately equal.

11. The device of claim 9, wherein the first distance, the second distance and the third distance are less than 40 nanometers.

12. A NAND flash memory device comprising:
a plurality of NAND strings of memory transistors, the plurality of NAND strings of memory transistors comprising a first NAND string of memory transistors; and
a source select line;
the first NAND string of memory transistors comprising a base layer, a source select transistor, a first memory transistor, and a second memory transistor;
the first memory transistor comprising:
a first gate electrode; and
a first charge trapping layer disposed between the base layer and the first gate electrode; and
the second memory transistor comprising:
a second gate electrode; and
a second charge trapping layer disposed between the base layer and the second gate electrode;
the source select transistor electrically connected to the source select line comprising:
a source select gate electrode; and
a source select charge trapping layer disposed between the base layer and the source select gate electrode;
wherein the source select transistor is at one end of the first NAND string of memory transistors, the first memory transistor is adjacent to the source select transistor and the second memory transistor is adjacent to the first memory transistor;
wherein the first memory transistor and second memory transistor are separated by a first distance, which defines a first region;
wherein there is no diffusion region in the first region defined by the first distance;
wherein a conductive path is formed in the first region between the first and second memory transistors due to gate fringing field effects associated with the first and second memory transistors;
wherein the first memory transistor does not include a diffusion region for source and/or drain;
wherein the second memory transistor does not include a diffusion region for source and/or drain;
wherein the first memory transistor and the source select transistor are separated by a second distance, which defines a second region;
wherein there is no diffusion region in the second region defined by the second distance;
wherein a conductive path is formed in the second region between the first memory transistor and the source select transistor due to gate fringing field effects associated with the first memory transistor and the source select transistor; and
wherein the source select transistor does not include a diffusion region for source and/or drain.

13. The NAND flash memory device of claim 12, wherein the first distance is less than 40 nanometers and the second distance is less than 40 nanometers.

14. The NAND flash memory device of claim 12, wherein the first charge trapping layer is a first floating gate of the NAND flash memory device, the second charge trapping layer is a second floating gate of the NAND flash memory device, and the source select charge trapping layer is a third floating gate of the NAND flash memory device.

15. The NAND flash memory device of claim 12:
wherein the first charge trapping layer comprises:
   a first oxide film;
   a first charge trap layer or a first charge trap layer stack; and
   a second oxide film;
wherein the second charge trapping layer comprises:
   a third oxide film;
   a second charge trap layer or a second charge trap layer stack; and
   a fourth oxide film; and
wherein the first charge trap layer or the first charge trap layer stack is disposed between the first oxide film and the second oxide film, and the second charge trap layer or the second charge trap layer stack is disposed between the third oxide film and the fourth oxide film.

16. The NAND flash memory device of claim 15, wherein the first charge trap layer or the first charge trap layer stack is a first nitride film or a first nitride film stack, and the second charge trap layer or second charge trap layer stack is a second nitride film or a second nitride film stack.

17. The NAND flash memory device of claim 16, wherein the first gate electrode comprises a first metal or a poly silicon film, and the second gate electrode comprises a second metal or a poly silicon film.

18. The NAND flash memory device of claim 12, further comprising:
a drain select transistor comprising:
   a drain select gate electrode; and
   a drain select charge trapping layer disposed between the base layer and the drain select gate electrode;
a third memory transistor comprising:
   a third gate electrode; and
   a third charge trapping layer disposed between the base layer and the third gate electrode;
wherein the third memory transistor and the drain select transistor are disposed in the first NAND string of memory transistors;
wherein the drain select transistor is at an other end of the first NAND string of memory transistors and the third memory transistor is adjacent to the drain select transistor;
wherein the third memory transistor and the drain select transistor are separated by a third distance, which defines a third region;
wherein there is no diffusion region in the third region defined by the third distance;
wherein a conductive path is formed in the third region between the third memory transistor and the drain select transistor due to gate fringing field effects associated with the third memory transistor and the drain select transistor; and
wherein the drain select transistor does not include a diffusion region for source and/or drain.

19. The NAND flash memory device of claim 18, wherein the first distance, the second distance and the third distance are approximately equal.

20. The NAND flash memory device of claim 18, wherein the first distance, the second distance and the third distance are less than 40 nanometers.

* * * * *